United States Patent
Jo et al.

(10) Patent No.: US 12,282,065 B2
(45) Date of Patent: Apr. 22, 2025

(54) BATTERY DATA MANAGEMENT SYSTEM AND METHOD

(71) Applicant: LG ENERGY SOLUTION, LTD., Seoul (KR)

(72) Inventors: Young Chang Jo, Daejeon (KR); Hyun Ju Hong, Daejeon (KR); Sung Yul Yoon, Daejeon (KR); Jae Kwang Jeon, Daejeon (KR); Jeong Bin Lee, Daejeon (KR); Jae Sung Im, Daejeon (KR); Won Kyung Kim, Daejeon (KR); Won Bin Choi, Daejeon (KR); Myung Hyun Shim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 75 days.

(21) Appl. No.: 17/715,523

(22) Filed: Apr. 7, 2022

(65) Prior Publication Data
US 2022/0404419 A1    Dec. 22, 2022

(30) Foreign Application Priority Data
Feb. 19, 2021   (KR) .......................... 10-2021-0022874

(51) Int. Cl.
*G01R 31/367*    (2019.01)
*H04L 67/12*    (2022.01)

(52) U.S. Cl.
CPC ............ *G01R 31/367* (2019.01); *H04L 67/12* (2013.01)

(58) Field of Classification Search
CPC . H01M 2010/4271; H01M 2010/4278; H01M 2200/00–30; H02J 7/0047; Y02E 60/10
USPC ........................................... 324/323
See application file for complete search history.

(56) References Cited

U.S. PATENT DOCUMENTS

| | | | |
|---|---|---|---|
| 10,921,381 B2 * | 2/2021 | Karner | G01R 31/392 |
| 2014/0342193 A1 * | 11/2014 | Mull | H01M 10/4257 429/61 |
| 2016/0101705 A1 * | 4/2016 | Kuraishi | B60L 53/62 320/109 |
| 2016/0224048 A1 * | 8/2016 | Rooyakkers | G05F 1/66 |
| 2016/0269958 A1 | 9/2016 | Tanigawa et al. | |
| 2018/0205121 A1 * | 7/2018 | Chiang | G01R 31/367 |
| 2019/0207267 A1 | 7/2019 | Vickery et al. | |

(Continued)

FOREIGN PATENT DOCUMENTS

| | | |
|---|---|---|
| JP | 6510167 B2 | 5/2019 |
| JP | 2019-153576 A | 9/2019 |

(Continued)

OTHER PUBLICATIONS

"ETL (Extract, Transform, Load)," IBM, Data Published Jul. 9, 2021, Accessed Online Aug. 14, 2023, https://www.ibm.com/topics/etl ) ( Year: 2021).*

*Primary Examiner* — Lisa M Caputo
*Assistant Examiner* — Joshua L Forristall
(74) *Attorney, Agent, or Firm* — Birch, Stewart, Kolasch & Birch, LLP

(57) ABSTRACT

A battery data management system includes a communication device for obtaining state data of a battery from a battery management system and transmitting the state data of the battery to an outside and a management server for managing the state data of the battery, received from the communication device through a first network.

16 Claims, 6 Drawing Sheets

(56) References Cited

U.S. PATENT DOCUMENTS

| | | | | |
|---|---|---|---|---|
| 2019/0312317 A1* | 10/2019 | Ballantine | ............. | H01M 10/48 |
| 2020/0014238 A1* | 1/2020 | Daniels | ............... | H01M 10/425 |
| 2020/0088796 A1* | 3/2020 | Werner | ............. | G01R 31/3835 |
| 2020/0295408 A1* | 9/2020 | Yang | ..................... | G01R 31/374 |
| 2021/0088867 A1* | 3/2021 | Nagel | ................. | G01N 21/8851 |
| 2021/0091581 A1* | 3/2021 | Kamijima | ............ | H01M 10/425 |
| 2021/0132152 A1* | 5/2021 | Choi | ..................... | H01M 10/48 |
| 2022/0258646 A1* | 8/2022 | Iida | ......................... | B60L 58/16 |

FOREIGN PATENT DOCUMENTS

| | | | | |
|---|---|---|---|---|
| KR | 10-0545267 B1 | | 1/2006 | |
| KR | 10-1201385 B1 | | 11/2012 | |
| KR | 101648401 B1 | * | 8/2016 | |
| KR | 10-1762534 B1 | | 7/2017 | |
| KR | 10-2017-0107214 A | | 9/2017 | |
| KR | 10-2017-0114347 A | | 10/2017 | |
| KR | 10-1954889 B1 | | 3/2019 | |
| KR | 20200080587 A | * | 7/2020 | ............ H04L 67/51 |
| KR | 10-2020-0095698 A | | 8/2020 | |

\* cited by examiner

BATTERY DATA MANAGEMENT SYSTEM AND METHOD

CROSS REFERENCE TO RELATED APPLICATION

The present application claims priority to Korean Patent Application No. 10-2021-0022874, filed Feb. 19, 2021 the entire contents of which is incorporated herein for all purposes by this reference.

BACKGROUND OF THE INVENTION

Field of the Invention

Embodiments disclosed herein relate to a battery data management system and method.

Description of the Related Art

Secondary batteries are generally used as battery racks including a battery module where a plurality of battery cells are connected to one another in series and/or in parallel. The battery rack may be managed and controlled by a battery management system in terms of a state and an operation. An energy storage system (ESS) including such a battery rack obtains key data through a battery management system (BMS) and a sensor, and stores log data indicating a state of a battery in a personal computer (PC)-based battery management system. The PC-based battery management system is an essential device provided on the site including the battery rack to control and protect the battery rack, and is not generally connected to a network for information security because high stability is required.

Thus, to check the state of the battery provided on the ESS site that is a space where the ESS is installed and to analyze a cause of a failure in the event of the failure, a manager needs to directly visit the site to perform the check and manually back up data, and additional management cost may incur. In the event of an emergency situation such as a fire on the ESS site, when the PC-based battery management system is damaged by the fire, it may be difficult to analyze a cause of an accident due to a data loss.

SUMMARY OF THE INVENTION

The present disclosure is proposed to solve these problems and aims to a battery data management system and method, in which various data of a battery may be automatically collected through a network and operation information of a battery installed in a private network may be integrally and efficiently managed.

Embodiments disclosed herein provide a battery data management system and method, in which data of a battery may be safely stored without a loss and a manager does not need to directly visit the site to maintain and repair the battery, thereby reducing battery management cost.

Technical problems of the embodiments disclosed herein are not limited to the above-described technical problems, and other unmentioned technical problems would be clearly understood by one of ordinary skill in the art from the following description.

A battery data management system according to an embodiment disclosed herein includes a communication device configured to obtain state data of a battery from a battery management system and transmit the state data of the battery to outside of the battery management system and a management server configured to receive the state data of the battery from the communication device through a first network and manage the state data of the battery.

According to an embodiment, the battery data management system may further include a cloud server configured to receive the state data of the battery through a second network that is different from the first network, store the state data of the battery, and transmit the state data of the battery to outside of the battery management system.

According to an embodiment, the first network may include a private network, and the second network may include a public network.

According to an embodiment, the communication device may be configured to select, as first data, data about diagnosis information indicating a failure of the battery from the state data of the battery, and transmit the first data to outside of the battery management system during a preset first period.

According to an embodiment, the communication device may be configured to directly transmit the first data to a web server of the management server, the web server displaying state information of the battery.

According to an embodiment, the first data may include a diagnosis value calculated by the battery management system to diagnose the failure of the battery.

According to an embodiment, the communication device may be further configured to transmit second data to outside of the battery management system within a preset second period, the second data including state information of the battery collected by the battery management system.

According to an embodiment, the communication device may be configured to transmit the second data to a big data server of the management server, the big data server storing the state information of the battery.

According to an embodiment, the management server may be further configured to diagnose the failure of the battery in advance by performing big data modeling analysis based on the second data.

According to an embodiment, the second data may further include sensing information about an environment in the vicinity of the battery.

According to an embodiment, the management server may include a web server that displays the state data of the battery to a user.

According to an embodiment, the management server may include an extract, transform, load (ETL) server that extracts the state data of the battery and transforms the state data into an analyzable form.

A battery data management method according to an embodiment disclosed herein includes obtaining, by a communication device connected to a battery management system, state data of a battery from the battery management system and transmitting, by the communication device, the state data of the battery to a management server through a first network.

According to an embodiment, the battery data management method may further include receiving and storing, by a cloud server, the state data of the battery, received from the communication device through a second network that is different from the first network and transmitting, by the cloud server, the state data of the battery to an outside.

According to an embodiment, the battery data management method may further include selecting, as first data, data about diagnosis information indicating a failure of the battery out of the state data of the battery and transmitting, by the communication device, the first data to outside of the battery management system within a preset first period.

According to an embodiment, the battery data management method may further include transmitting, by the communication device, second data to outside of the battery management system within a preset second period, the second data including state information of the battery collected by the battery management system, to outside of the battery management system in a preset second period.

According to an embodiment, the battery data management method may further include diagnosing, by the management server, a failure of the battery in advance by performing big data modeling analysis based on the second data.

DETAILED DESCRIPTION OF THE INVENTION

Figure 1:
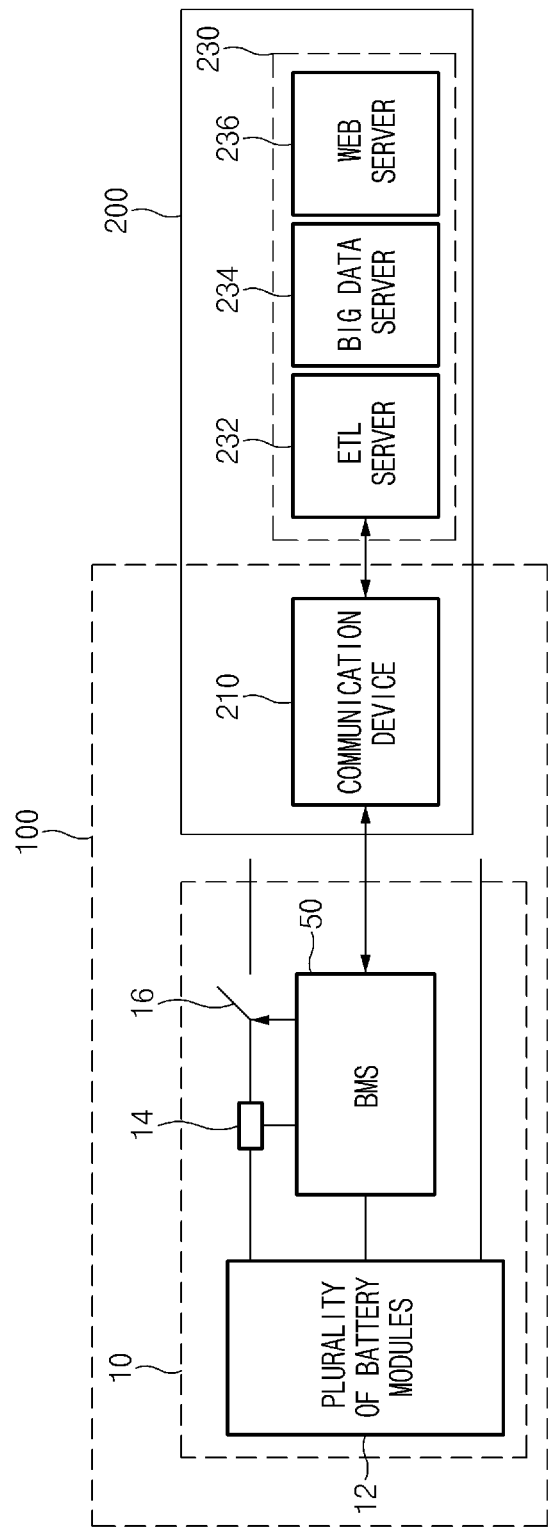
FIG. 1 is a block diagram of a battery data management system and a battery rack according to an embodiment disclosed herein.

Hereinafter, various embodiments disclosed herein will be described in detail with reference to the accompanying drawings. In this document, identical reference numerals will be used for identical components in the drawings, and the identical components will not be redundantly described.

For various embodiments disclosed herein, specific structural or functional descriptions are only exemplified for the purpose of describing the embodiments, and various embodiments disclosed herein may be implemented in various forms, and should not be construed as being limited to the embodiments described herein.

As used in various embodiments, the terms "1st", "2nd", "first", "second", or the like may modify various components regardless of importance, and do not limit the components. For example, a first component may be named as a second component without departing from the right scope of an embodiment disclosed herein, and similarly, the second component may be named as the first component.

Terms defined in the present disclosure are used for only describing a specific exemplary embodiment and may not have an intention to limit the scope of other exemplary embodiments. It is to be understood that the singular forms include plural references unless the context clearly dictates otherwise.

All terms including technical and scientific terms used herein have the same meaning as commonly understood by one of ordinary skill in the art to which the embodiments disclosed herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some case, terms defined in the present disclosure cannot be analyzed to exclude embodiments disclosed herein.

FIG. 1 is a block diagram of a battery data management system and a battery rack according to an embodiment disclosed herein.

More specifically, FIG. 1 schematically shows mutual communication between a battery data management system and a battery rack 10, according to an embodiment disclosed herein.

As shown in FIG. 1, the battery rack 10 may include a plurality of battery modules 12, a sensor 14, a switching unit 16 (e.g., switch), and a battery management system (BMS) 50. The battery rack 10 may include the battery module 12, the sensor 14, the switching unit 16, and the battery management system 50 provided in plural.

The plurality of battery modules 12 may include one or more chargeable/dischargeable battery cells. In this case, the plurality of battery modules 12 may be connected in series or in parallel.

The sensor 14 may detect current flowing in the battery rack 10. In this case, a detected signal of current may be transmitted to the battery management system 50.

The switching unit 16 may be connected in series to a (+) terminal side or a (−) terminal side of the battery module 12 to control the charging/discharging current flow of the battery module 12. For example, the switching unit 16 may use at least one relay, a magnetic contactor, etc., according to the specifications of the battery rack 10.

The battery management system 50 may monitor the voltage, current, temperature, etc., of the battery rack 10 to perform control and management to prevent overcharging and overdischarging, etc., and may include, for example, a rack BMS (RBMS).

The battery management system 50, which is an interface for receiving measurement values of the above-described various parameter values, may include a plurality of terminals and a circuit, etc., connected thereto to process input values. The battery management system 50 may control on/off of the switching unit 16, e.g., a relay, a contactor, etc., and may be connected to the battery module 12 to monitor the state of each battery module 12.

Meanwhile, the battery management system 50 disclosed herein may collect state data, such as voltage, current, temperature, etc., of the battery module 12 and transmit such data to an external server through a communication device 210. In particular, the communication device 210 connected to the battery management system 50 may select main data allowing occurrence of a failure of the battery to be determined from the battery management system 50 and transmit the main data directly to a management server 230. The communication device 210 may also collect entire state data stored in the battery management system 50 in a specific time unit (e.g., daily) and transmit the state data to the management server 230.

A battery data management system 200 according to an embodiment disclosed herein may include the communication device 210 and the management server 230. Moreover, the management server 230 may include an extract, transform, load (ETL) server 232, a big data server 234, and a web server 236. Herein, the battery data management system 200 may be connected to the battery management system 50 provided in the battery rack 10 to receive various data about the state of the battery from the battery management system 50 that collects state data of the battery from the battery rack 10. The battery rack 10 and the communication device 210 may be provided on a communication network of an ESS installation site 100.

The communication device 210 may obtain the state data of the battery from the battery management system 50 and transmit the state data to outside of the battery management system. In this case, the communication device 210 may include an Internet of Things (IoT) communication device connected to the battery management system 50 included in the battery rack 10. That is, the communication device 210 may connect to an external Internet network and perform a network function, in place of the battery management system 50 not connected to a network for security.

More specifically, the communication device 210 may select, as first data, main data about diagnosis information indicating whether a failure occurs in the battery, out of the state data of the battery received from the battery management system 50, and transmit the first data to outside of the battery management system in a preset period (a first period) (e.g., a unit of one minute to several minutes). For example, the first data may include data calculated by the battery management system 50 to diagnose a failure of the battery, such as diagnosis values like maximum and minimum voltages for each battery cell, an average voltage of battery cells, a state of charge (SOC), a state of health (SOH), etc. The communication device 210 may directly transmit the first data to the web server 236 through the ETL server 232 of the management server 230.

The communication device 210 may transmit second data that is state data of the entire battery included in the battery rack 10, collected for a certain period (e.g., one day) from the battery management system 50, to outside of the battery management system in a preset period (a second period) (e.g., daily). For example, the second data may include state information (voltage, current, internal temperature, etc.) of the entire battery and sensing information (outside temperature, humidity, etc.) about an environment in the vicinity of the battery, which are collected for a certain time. In this case, the communication device 210 may transmit the second data to the web server 236 through the ETL server 232 and the big data server 234 of the management server 230.

The management server 230 may manage the state data of the battery, received through a first network that is different from a second network of a cloud server 220 described below. For example, the first network used in the management server 230 may be a private network. The management server 230 may integrally operate and manage the battery of the entire ESS site and immediately recognize the failure of the battery or detect the failure of the battery in advance through big data analysis.

The ETL server 232 may extract the state data of the battery, received from the battery management system 50 through the communication device 210, and transform the state data into an analyzable form. For example, the ETL server 232 may transform data into a form analyzable in the big data server 234 or a terminal of a user, etc., by performing pre-processing through time reversal removal, redundant data removal, time unit setting, file format conversion, etc.

The big data server 234 may collect the state data of the battery transformed by the ETL server 232 and store the state data for a long term. For example, the big data server 234 may compress and entire data (e.g., the second data) collected for a specific time out of the state data of the battery to collectively manage data in one spot regardless of an ESS installation site. The big data server 234 may perform big data modeling analysis based on the state data of the battery, thereby diagnosing a failure of the battery in advance.

The web server 236 may display the state information of the battery to the user. That is, the web server 236 may display real-time state information and occurrence of a failure, received by unit of several minutes through the communication device 210, through a user interface (UI). The web server 236 may display a result of analyzing, by the big data server 234, the entire state data of the battery received by unit of one day or several days through the communication device 210.

As such, the battery data management system 200 according to an embodiment disclosed herein may automatically collect various data of the battery through a network, and integrally and efficiently operation information of a battery installed in a private network.

The battery data management system 200 according to an embodiment disclosed herein may safely store data of a battery without a loss, and a manager does not need to directly visit the site to maintain and repair the battery, thereby reducing battery management cost.

Figure 2:
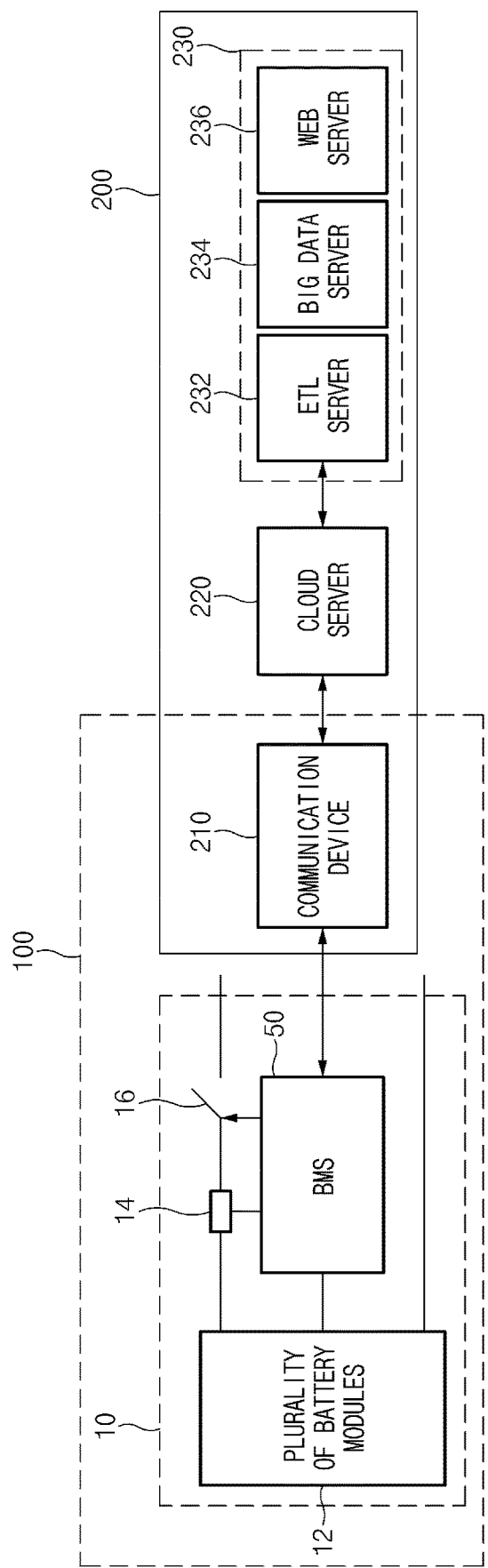
FIG. 2 is a block diagram of a battery data management system and a battery rack according to another embodiment disclosed herein.

FIG. 2 is a block diagram of a battery data management system and a battery rack according to another embodiment disclosed herein.

Referring to FIG. 2, the battery rack 10 may include a plurality of battery modules 12, a sensor 14, a switching unit 16, and a battery management system (BMS) 50. In addition, the battery data management system 200 according to an embodiment disclosed herein may include the communication device 210, the cloud server 220, and the management server 230. That is, the battery data management system 200 according to an embodiment of FIG. 2 may have the same structure as that of FIG. 1 except that the cloud server 220 for relaying communication between the communication device 210 and the management server 230 is further included.

The cloud server 220 may temporarily store the state data of the battery, received from the communication device 210 through the second network, and transmit the state data to the management server 230. For example, the second network used in the cloud server 220 may be a public network.

As such, the cloud server 220 may serve as a buffer between an ESS site including the battery rack 10 and the management server 230. That is, the cloud server 220 may secure stability for data transmission by preventing speed delay or data loss depending on a physical position of the management server 230 (in particular, the big data server 234) provided on the private network. For example, the cloud server 220 may prevent a communication delay between the big data server 234 located in Korea and an ESS site located in the US.

Figure 3:
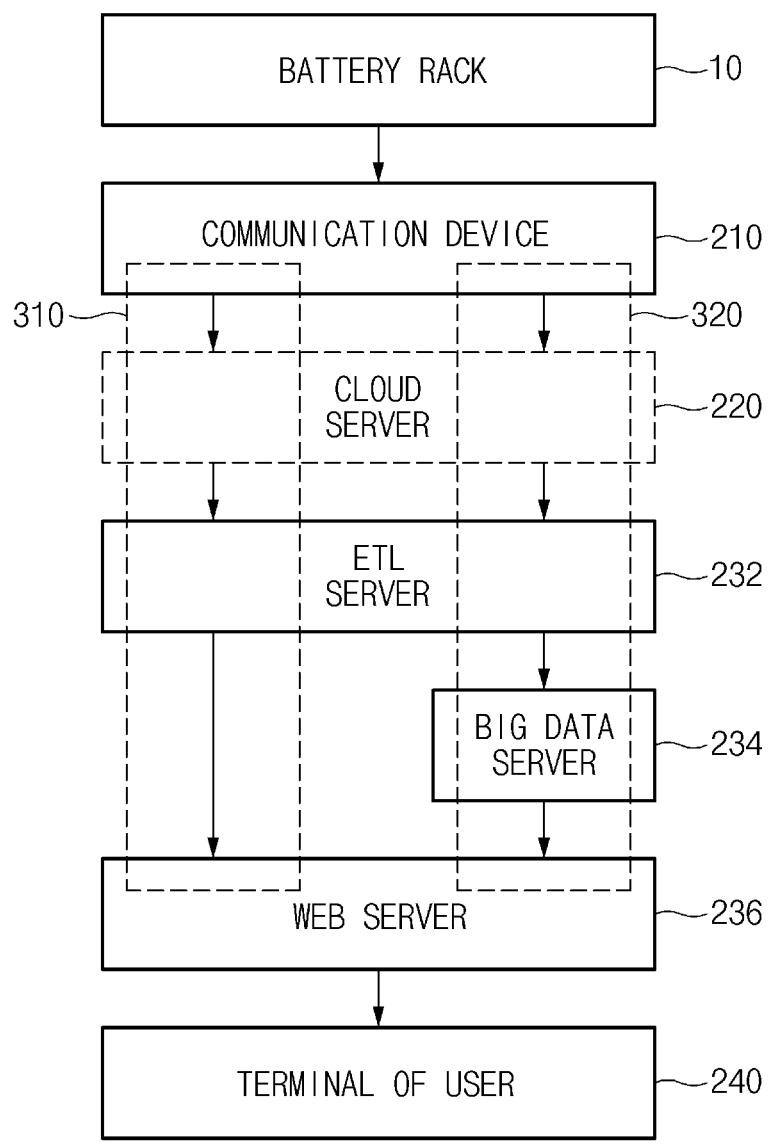
FIG. 3 is a diagram showing operations of a battery data management system according to an embodiment disclosed herein.

FIG. 3 is a diagram showing operations of a battery data management system according to an embodiment disclosed herein.

Referring to FIG. 3, the battery management system 50 provided on an ESS site installed in each area may receive state information such as voltages, currents, temperatures, etc., of battery cells included in the battery rack 10, and sensing information such as outside of the battery management system temperature, humidity, etc., from a sensor provided in the battery rack 10. The battery management system 50 may calculate diagnosis values such as maximum/minimum/average voltages, SOC, SOH, etc., of the battery cell, based on the state information and the sensing information.

The communication device 210 connected to the battery management system 50 may receive the state data (i.e., the state information, the sensing information, the diagnosis values, etc.) of the battery collected in the battery management system 50. The communication device 210 may be configured to transmit the received state data to an external server by being connected to the network.

In this case, to monitor a failure of the battery in real time, the communication device 210 may collect a diagnosis value (the first data) of the battery by unit of one minute or several minutes and temporarily store the diagnosis value in the cloud server 220 to monitor a failure of the battery in real time, may pre-process the diagnosis value in the ETL server 232, and then transmit the pre-processed diagnosis value to the web server 236, as indicated by 310. Thus, the web server 236 may perform display to allow the user to check abnormality of the battery of the ESS site in real time.

The communication device 210 may collect the state information and the sensing information (the second data) of the entire battery by unit of one minute or several minutes and temporarily store the state information and the sensing information in the cloud server 220, may pre-process the state information and the sensing information in the ETL server 232, and then transmit the state information and the sensing information to the bit data server 234, as indicated by 320. The big data server 234 may compress and store the state information and the sensing information of the battery to store them for a long term. The big data server 234 may perform big data modeling analysis based on such data, thereby allowing the user to predict a failure of the battery. The state data, big data analysis result information, etc., stored in the big data server 234 may be transmitted to the web server 236 so as to be checked by the user.

The user may download various data such as state data, failure diagnosis information, big data analysis result information, etc., of the battery from the web server 236 through a terminal (e.g., a PC, a tablet, a cellular phone, etc.) 240 of the user. Thus, the user may check the analysis result information of the management server 230 through the terminal 240 of the user or may directly analyze the state data of the battery through a program, etc., provided in the terminal 240 of the user.

Meanwhile, it is shown in FIG. 3 that the cloud server 220 relays communication between the communication device 210 and the ETL server 232 of the management server 230, but the cloud server 220 may be omitted as described with reference to FIG. 1. Moreover, it is described in FIG. 3 that data obtained in the communication device 210 is directly transmitted to the web server 236 through the ETL server 232 (the first data) or is transmitted to the web server 236 after being stored in the big data server 234 (the second data), but some of the ETL server 232, the big data server 234, and the web server 236 of the management server 230 may be omitted as needed.

As such, the battery data management system according to an embodiment disclosed herein may collect data about the state of the battery from each ESS site and store the data for a long time without a need for the manager to directly visit the site, and perform analysis based on the collected data, thereby detecting and predicting a failure of the battery.

Figure 4:
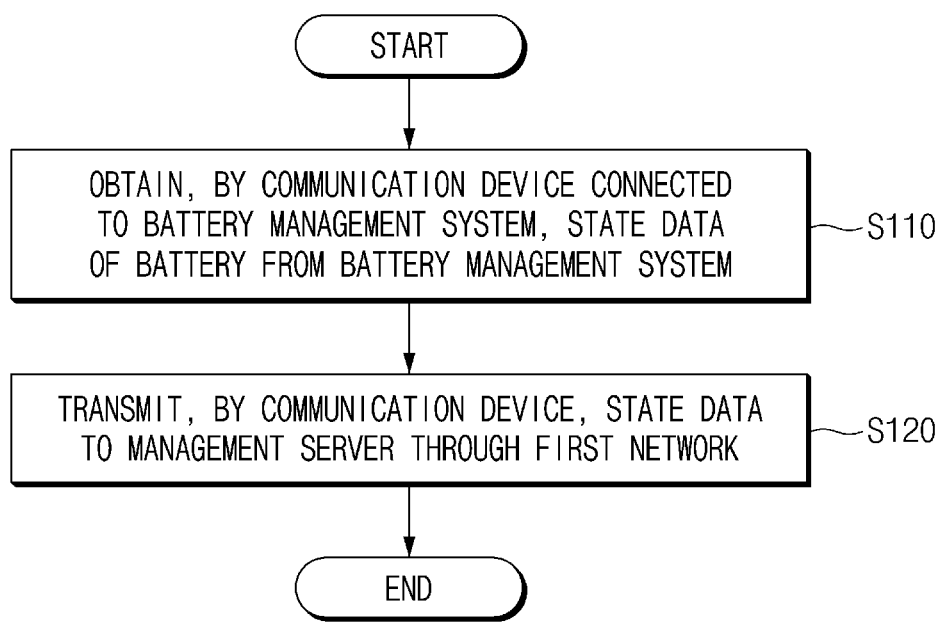
FIG. 4 is a flowchart showing a battery data management method according to an embodiment disclosed herein.

FIG. 4 is a flowchart showing a battery data management method according to an embodiment disclosed herein.

Referring to FIG. 4, in a battery data management method according to an embodiment disclosed herein, a communication device connected to a battery management system may obtain state data of a battery from the battery management system, in operation S110. As such, the communication device may connect to an external Internet network and perform a network function, in place of the battery management system not connected to a network for security.

More specifically, in operation S110, the communication device may select, as first data, main data about diagnosis information indicating whether a failure occurs in the battery, out of the state data of the battery received from the battery management system, and transmit the first data to outside of the battery management system in a preset period (a first period) (e.g., a unit of one minute to several minutes). For example, the first data may include data calculated by the battery management system to diagnose a failure of the battery, such as diagnosis values like maximum and minimum voltages for each battery cell, an average voltage of battery cells, an SOC, an SOH, etc.

In operation S110, the communication device may transmit second data that is state data of the entire battery included in the battery rack, collected for a certain period (e.g., one day) from the battery management system, to outside of the battery management system in a preset period (a second period) (e.g., daily). For example, the second data may include state information (voltage, current, internal temperature, etc.) of the entire battery and sensing information (outside temperature, humidity, etc.) about an environment in the vicinity of the battery, which are collected for a certain time.

The communication device may transmit the state data to a management server through the first network, in operation S120. In operation S120, the management server may manage the state data of the battery, received through the first network that is different from the second network of a cloud server described above. For example, the first network used in the management server may be a private network.

The management server may integrally operate and manage the battery of the entire ESS site and immediately recognize the failure of the battery or detect the failure of the battery in advance through big data analysis. For example, the ETL server of the management server may extract the state data of the battery received through the communication device from the battery management system and transform the state data into an analyzable form. The big data server may collect state data of the battery, store the state data for a long term, and perform big data modeling analysis based on the state data of the battery, thereby diagnosing a failure of the battery in advance.

The web server of the management server may display the state information of the battery to the user. That is, the web server may display, through a UI, information such as real-time state information and occurrence of a failure, received by unit of several minutes through the communication device, an analysis result of the big data server with respect to the entire state data of the battery received by unit of one day or several days, etc.

As such, the battery data management method according to an embodiment disclosed herein may automatically collect various data of the battery through a network, and integrally and efficiently operation information of a battery installed in a private network.

The battery data management method according to an embodiment disclosed herein may safely store data of a battery without a loss, and a manager does not need to directly visit the site to maintain and repair the battery, thereby reducing battery management cost.

Figure 5:
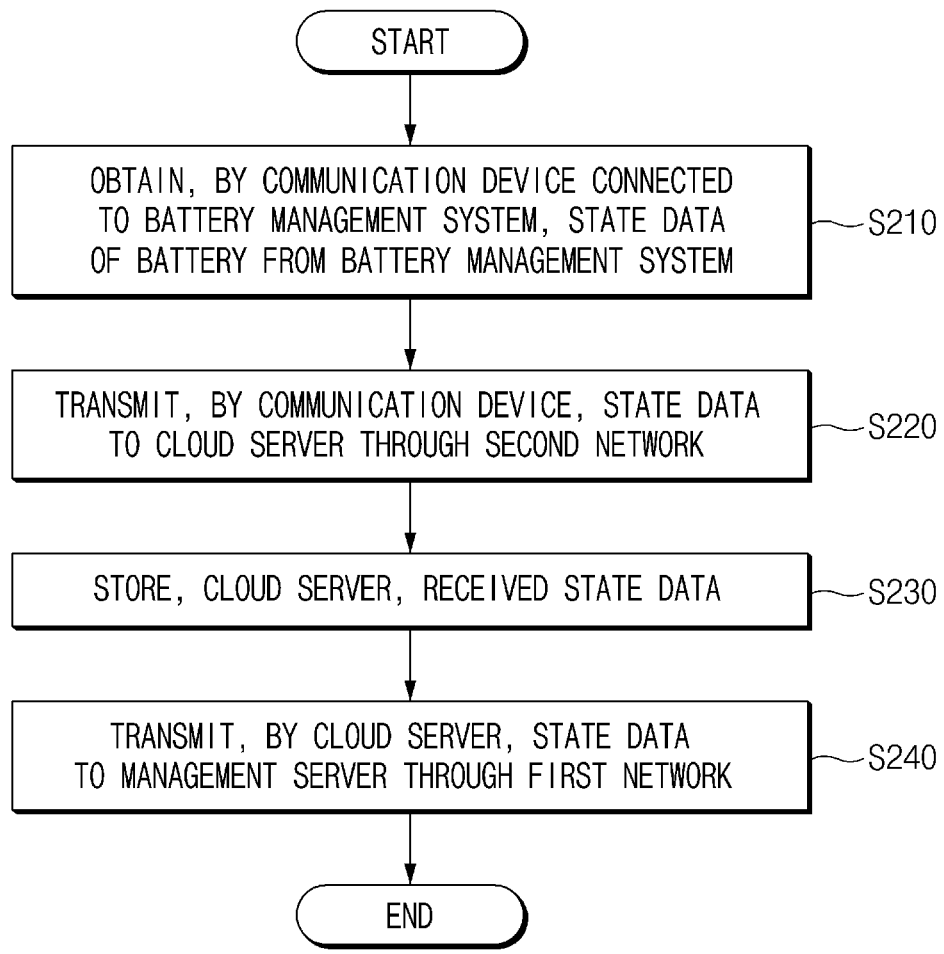
FIG. 5 is a flowchart showing a battery data management method according to another embodiment disclosed herein.

FIG. 5 is a flowchart showing a battery data management method according to another embodiment disclosed herein.

Referring to FIG. 5, a battery data management method according to another embodiment disclosed herein is substantially the same as the battery data management method of FIG. 4 except that the communication device transmits state data of the battery received from the battery management system to the management server via the cloud server, and thus will not be described in detail.

First, in a battery data management method according to another embodiment disclosed herein, a communication device connected to a battery management system may obtain state data of a battery from the battery management system, in operation S210. The communication device may transmit the state data to the cloud server through the second network, in operation S220. For example, the second network may be a public network.

The cloud server may temporarily store the state data received from the communication device, in operation S230. The cloud server may serve as a buffer between the ESS site including the battery rack and the management server. Next, the cloud server may transmit the state data to the management server through the first network, in operation S240. Thus, the management server may perform big data analysis based on the received state data of the battery or display state information of the battery of each ESS site to the user through the web page.

Figure 6:
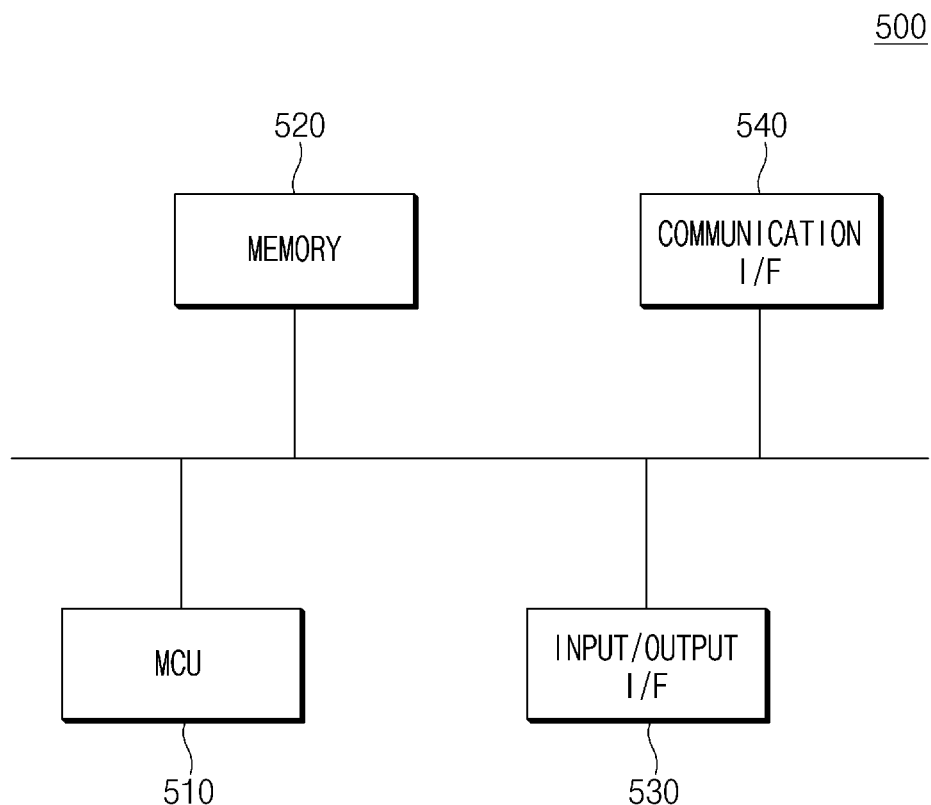
FIG. 6 is a diagram showing a hardware configuration of a computing system for performing a battery data management method, according to an embodiment disclosed herein.

FIG. 6 is a diagram showing a hardware configuration of a computing system for performing a method for managing battery data, according to an embodiment disclosed herein.

Referring to FIG. 6, a computing system 500 according to an embodiment disclosed herein may include a microcontroller unit (MCU) 510, a memory 520, an input/output interface (I/F) 530, and a communication I/F 540.

The MCU 510 may be a processor that executes various programs (e.g., a battery state data collection program, a big data analysis program, etc.) stored in the memory 520, processes various data including ESS site information, battery state information, sensing information, diagnosis values, etc., through these programs, and executes the above-described functions of the battery data management system shown in FIG. 2.

The memory 520 may store various programs regarding state data collection and analysis of the battery, etc. The memory 520 may also store various data such as ESS site information, state information, sensing information, diagnosis values, an analysis result, etc., of the battery.

The memory 520 may be provided in plural, depending on a need. The memory 520 may be a volatile memory or a nonvolatile memory. For the memory 520 as the volatile memory, random access memory (RAM), dynamic RAM (DRAM), static RAM (SRAM), etc., may be used. For the memory 520 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 520 are merely examples and are not limited thereto.

The input/output I/F 530 may provide an interface for transmitting and receiving data by connecting an input device (not shown) such as a keyboard, a mouse, a touch panel, etc., and an output device such as a display (not shown), etc., with the MCU 510.

The communication I/F 540, which is a component capable of transmitting and receiving various data to and from a server, may be various types of devices capable of supporting wired or wireless communication. For example, a program for battery state data collection and big data analysis or various data may be transmitted and received to and from a separately provided external server through the communication I/F 540.

As such, a computer program according to an embodiment disclosed herein may be recorded in the memory 520 and processed by the MCU 510, thus being implemented as a module that performs functions shown in FIG. 2.

The battery data management system and method according to an embodiment disclosed herein may automatically collect various data of the battery through a network, and integrally and efficiently operation information of a battery installed in a private network.

The battery data management system and method according to an embodiment disclosed herein may safely store data of a battery without a loss, and a manager does not need to directly visit the site to maintain and repair the battery, thereby reducing battery management cost.

Even though all components constituting an embodiment disclosed herein have been described above as being combined into one or operating in combination, the embodiments disclosed herein are not necessarily limited to the embodiments. That is, within the object scope of the embodiments disclosed herein, all the components may operate by being selectively combined into one or more.

Moreover, terms such as "include", "constitute" or "have" described above may mean that the corresponding component may be inherent unless otherwise stated, and thus should be construed as further including other components rather than excluding other components. All terms including technical or scientific terms have the same meanings as those generally understood by those of ordinary skill in the art to which the embodiments disclosed herein pertain, unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present document.

The above description is merely illustrative of the technical idea of the present disclosure, and various modifications and variations will be possible without departing from the essential characteristics of embodiments of the present disclosure by those of ordinary skill in the art to which the embodiments disclosed herein pertains. Therefore, the embodiments disclosed herein are intended for description rather than limitation of the technical spirit of the embodiments disclosed herein and the scope of the technical spirit of the present disclosure is not limited by these embodiments disclosed herein. The protection scope of the technical spirit disclosed herein should be interpreted by the following claims, and all technical spirits within the same range should be understood to be included in the range of the present document.

The invention claimed is:

1. A battery data management system comprising:
a communication device configured to:
obtain state data of a battery from a battery management system, and
transmit the state data of the battery to outside the battery management system; and
a management server including:
an extract, transform, load (ETL) server;
a big data server; and
a web server,
wherein the management server is configured to:
receive the state data of the battery from the communication device through a first network,
manage the state data of the battery, and
control the battery management system to open or close a switch of the battery management system, wherein the communication device is configured to:
  select, out of the state data, first data, which is data about diagnosis information indicating a failure of the battery from the state data of the battery, and directly transmit the first data from the ETL server to the web server of the management server, the web server being configured to display both the first data and state information of the battery,
wherein the ETL server is configured to extract the state data and transform the state data into a form analyzable in the big data server or a terminal of a user,
wherein the big data server is configured to store the extracted state data and perform big data modeling analysis based on the state data to diagnose the failure of the battery in advance, and
wherein the web server is configured to display the state information of the battery based on the big data modeling analysis performed by the big data server.

2. The battery data management system of claim 1, wherein the management server further includes a cloud server configured to:
  receive the state data of the battery through a second network that is different from the first network,
  store the state data of the battery, and
  transmit the state data of the battery to the outside of the battery management system.

3. The battery data management system of claim 2, wherein the first network comprises a private network, and the second network comprises a public network.

4. The battery data management system of claim 1, wherein the communication device is configured to transmit the first data to the outside of the battery management system within a preset first period.

5. The battery data management system of claim 4, wherein the first data comprises a diagnosis value calculated by the battery management system to diagnose the failure of the battery.

6. The battery data management system of claim 1, wherein the communication device is further configured to transmit data to the outside of the battery management system within a preset period, the data including the state information of the battery collected by the battery management system.

7. The battery data management system of claim 6, wherein the communication device is configured to transmit the data to the big data server of the management server.

8. The battery data management system of claim 6, wherein the data further includes sensing information about an environment in a vicinity of the battery.

9. The battery data management system of claim 1, wherein the first data comprises pre-processed diagnosis values used to determine the failure of the battery.

10. The battery data management system of claim 9, wherein the pre-processed diagnosis values are stored in a cloud server.

11. A battery data management method comprising:
  obtaining, by a communication device connected to a battery management system, state data of a battery from the battery management system;
  transmitting, by the communication device, the state data of the battery to a management server of a battery data management system through a first network;
  selecting, out of the state data, first data, which is data about diagnosis information indicating a failure of the battery from the state data of the battery;
  directly transmitting, the first data from an extract, transform, load (ETL) server to a web server of the management server, the web server being configured to display both the first data and state information of the battery;
  controlling the battery management system to open or close a switch of the battery management system, by the battery data management system;
  detecting, by the management server, the failure of the battery in advance;
  extracting, via the ETL server of the battery data management system, the state data and transforming the state data into a form analyzable in a big data server of the battery data management system or a terminal of a user;
  extracting, by the big data server, the state data and performing big data modeling analysis based on the state data to diagnose the failure of the battery in advance; and
  displaying, by the web server of the battery data management system, the first data and the state information of the battery based on the big data modeling analysis performed by the big data server.

12. The battery data management method of claim 11, further comprising:
  receiving and storing, by a cloud server, the state data of the battery, received from the communication device through a second network that is different from the first network; and
  transmitting, by the cloud server, the state data of the battery to outside the battery management system.

13. The battery data management method of claim 11, further comprising transmitting, by the communication device, the first data to outside the battery management system within a preset first period.

14. The battery data management method of claim 11, further comprising transmitting, by the communication device, data to outside the battery management system within a preset period, the data including the state information of the battery collected by the battery management system.

15. The battery data management method of claim 11, wherein the first data comprises pre-processed diagnosis values used to determine the failure of the battery.

16. The battery data management method of claim 15, wherein the pre-processed diagnosis values are stored in a cloud server.

* * * * *